US008471267B2

(12) United States Patent
Hayashi et al.

(10) Patent No.: US 8,471,267 B2
(45) Date of Patent: Jun. 25, 2013

(54) SEMICONDUCTOR DEVICE AND METHOD FOR PRODUCING SAME

(75) Inventors: Masashi Hayashi, Osaka (JP); Koichi Hashimoto, Osaka (JP); Kazuhiro Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/129,825

(22) PCT Filed: Aug. 26, 2010

(86) PCT No.: PCT/JP2010/005275
§ 371 (c)(1),
(2), (4) Date: May 18, 2011

(87) PCT Pub. No.: WO2011/027523
PCT Pub. Date: Mar. 10, 2011

(65) Prior Publication Data
US 2011/0220917 A1    Sep. 15, 2011

(30) Foreign Application Priority Data
Sep. 3, 2009    (JP) ................................. 2009-203548

(51) Int. Cl.
*H01L 29/12*    (2006.01)
*H01L 21/31*    (2006.01)

(52) U.S. Cl.
USPC .. 257/77; 438/763; 257/E29.068; 257/E21.24

(58) Field of Classification Search
USPC ............... 257/77, E29.068, E21.24, E21.041, 257/288, 135, 136, 242, 329, 341; 438/763, 438/197, 199, 201, 207, 216
See application file for complete search history.

(56) References Cited

U.S. PATENT DOCUMENTS 5,976,936 A    11/1999    Miyajima et al.
6,548,900 B1 *    4/2003    Kusumi ..................... 257/758
(Continued)

FOREIGN PATENT DOCUMENTS

| JP | 59-194441 A1 | 11/1984 |
| JP | 07-131033 A1 | 5/1995 |

(Continued)

OTHER PUBLICATIONS

International Search Report for corresponding International Application No. PCT/JP2010/005275 mailed Nov. 30, 2010.

*Primary Examiner* — Kimberly Rizkallah
*Assistant Examiner* — Mounir Amer
(74) *Attorney, Agent, or Firm* — Renner, Otto, Boisselle & Sklar, LLP

(57) ABSTRACT

A semiconductor device of the present invention has a semiconductor element region 17 that is provided in part of a silicon carbide layer 3 and a guard-ring region 18 that is provided in another part of the silicon carbide layer 3 surrounding the semiconductor element region 17 when seen in a direction perpendicular to a principal surface of the silicon carbide layer 3. The semiconductor device includes: an interlayer insulation film 10 which is provided on the principal surface of the silicon carbide layer 3 in the semiconductor element region 17 and the guard-ring region 18, the interlayer insulation film 10 having a relative dielectric constant of 20 or more; a first protective insulation film 14 provided on the interlayer insulation film in the guard-ring region 18; and a second protective insulation film 15 provided on the first protective insulation film 14, wherein the first protective insulation film 14 has a linear expansion coefficient which is between a linear expansion coefficient of a material of the second protective insulation film 15 and a linear expansion coefficient of a material of the interlayer insulation film 10.

11 Claims, 9 Drawing Sheets

U.S. PATENT DOCUMENTS

| | | | |
|---|---|---|---|
| 7,569,892 B2* | 8/2009 | Zhu et al. | 257/369 |
| 7,737,556 B2* | 6/2010 | Wang et al. | 257/753 |
| 8,143,131 B2* | 3/2012 | Hsu et al. | 438/303 |
| 2001/0009788 A1 | 7/2001 | Lipkin et al. | |
| 2003/0067033 A1 | 4/2003 | Kinoshita et al. | |
| 2003/0107041 A1* | 6/2003 | Tanimoto et al. | 257/77 |
| 2006/0043480 A1* | 3/2006 | Tsuchitani et al. | 257/341 |
| 2007/0187695 A1* | 8/2007 | Nakamura et al. | 257/77 |
| 2008/0001159 A1* | 1/2008 | Ota et al. | 257/77 |
| 2008/0224149 A1* | 9/2008 | Yoshie | 257/77 |
| 2008/0227247 A1* | 9/2008 | Engel et al. | 438/197 |
| 2009/0008650 A1* | 1/2009 | Mizukami et al. | 257/77 |
| 2009/0050898 A1* | 2/2009 | Tanimoto et al. | 257/77 |
| 2009/0090920 A1* | 4/2009 | Endo et al. | 257/77 |
| 2009/0134405 A1* | 5/2009 | Ota et al. | 257/77 |
| 2009/0236611 A1* | 9/2009 | Yamamoto et al. | 257/77 |
| 2010/0025820 A1* | 2/2010 | Suekawa | 257/584 |

FOREIGN PATENT DOCUMENTS

| | | |
|---|---|---|
| JP | 07-193129 A1 | 7/1995 |
| JP | 10-308510 A1 | 11/1998 |
| JP | 11-297995 A1 | 10/1999 |
| JP | 2003-101039 A1 | 4/2003 |
| JP | 2004-158603 A1 | 6/2004 |
| JP | 2006-222210 A1 | 8/2006 |
| JP | 2007-066944 A1 | 3/2007 |

* cited by examiner

FIG.3
(a)
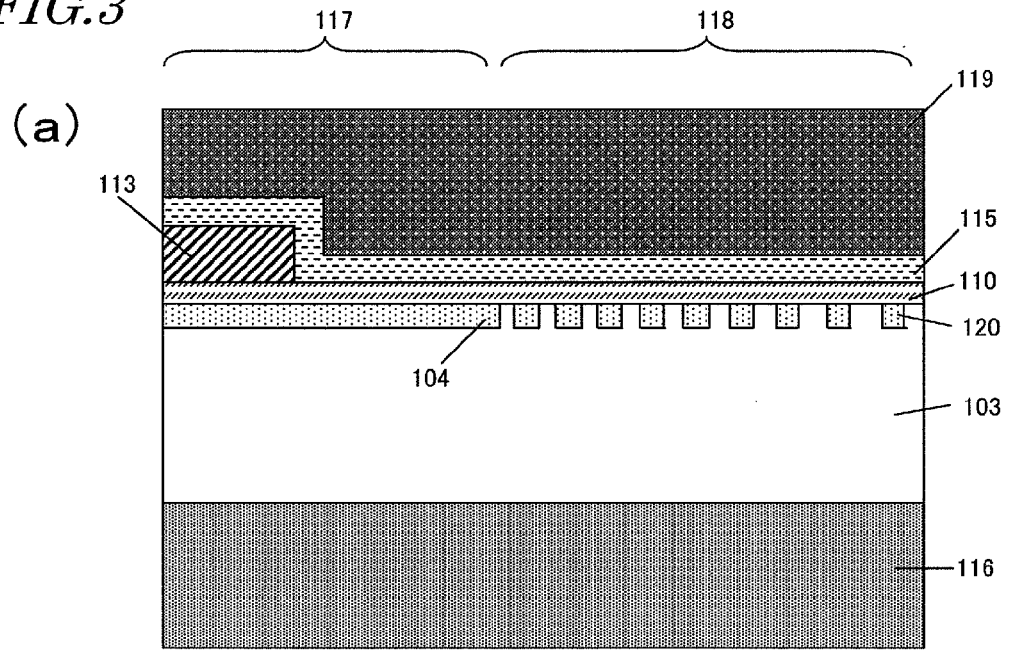
(b)
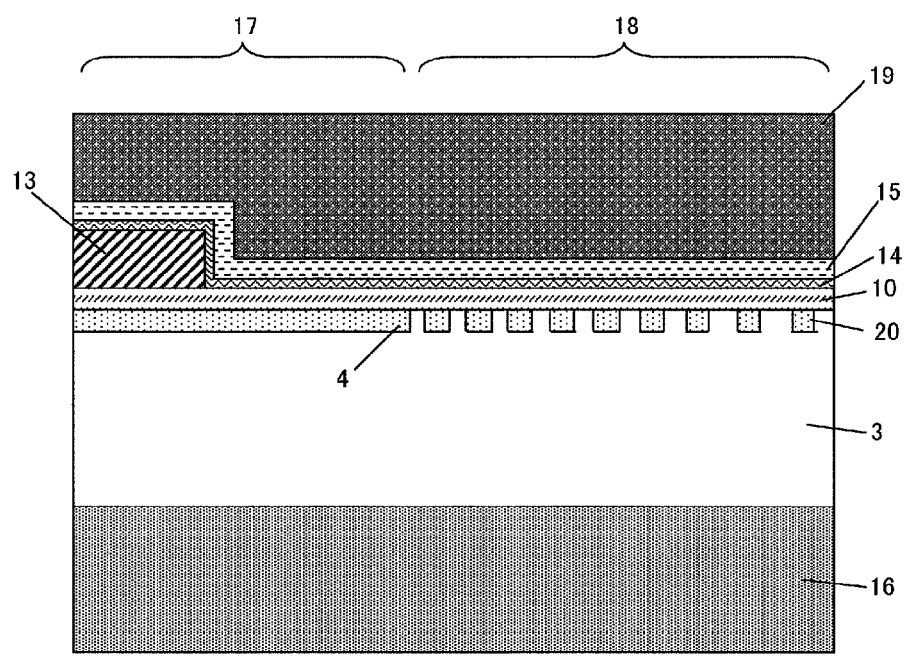

FIG.4
(a)
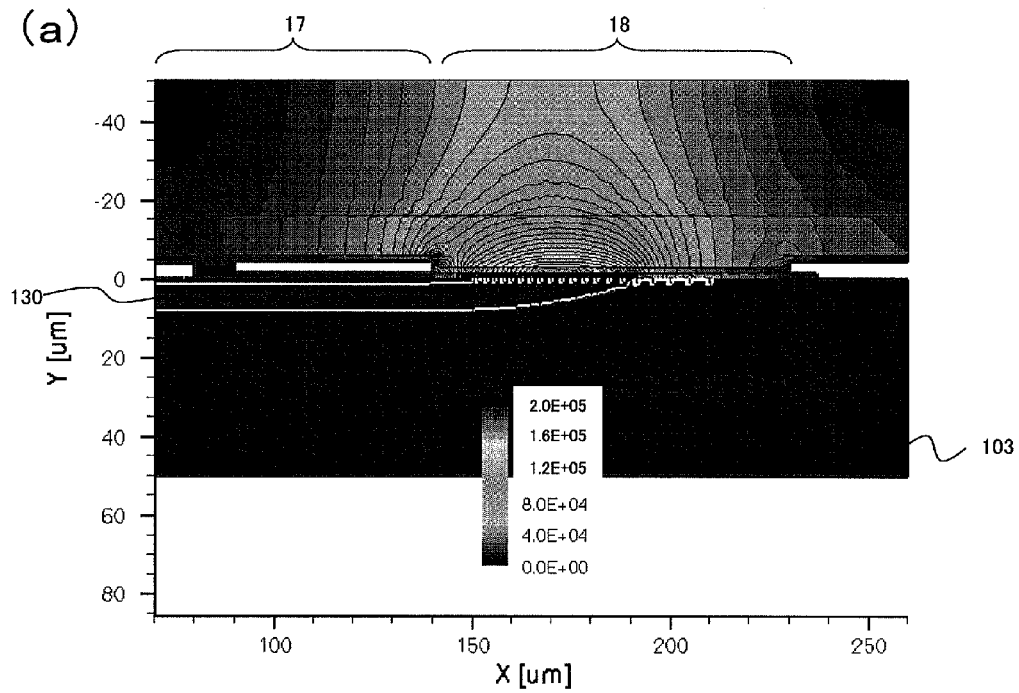
(b)
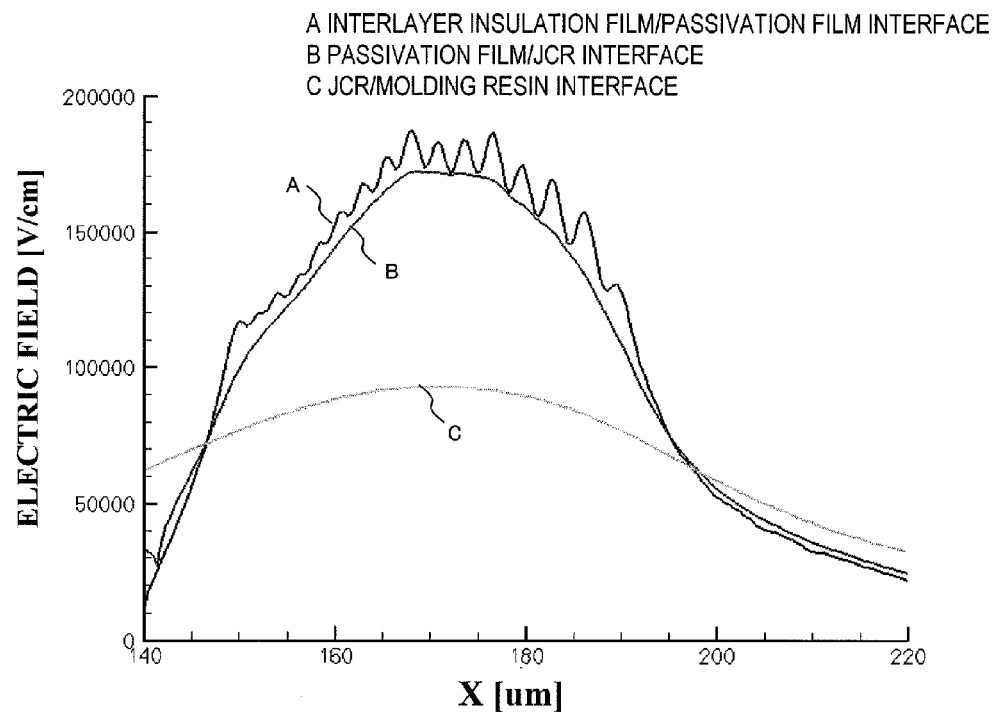

*FIG.5*
(a)
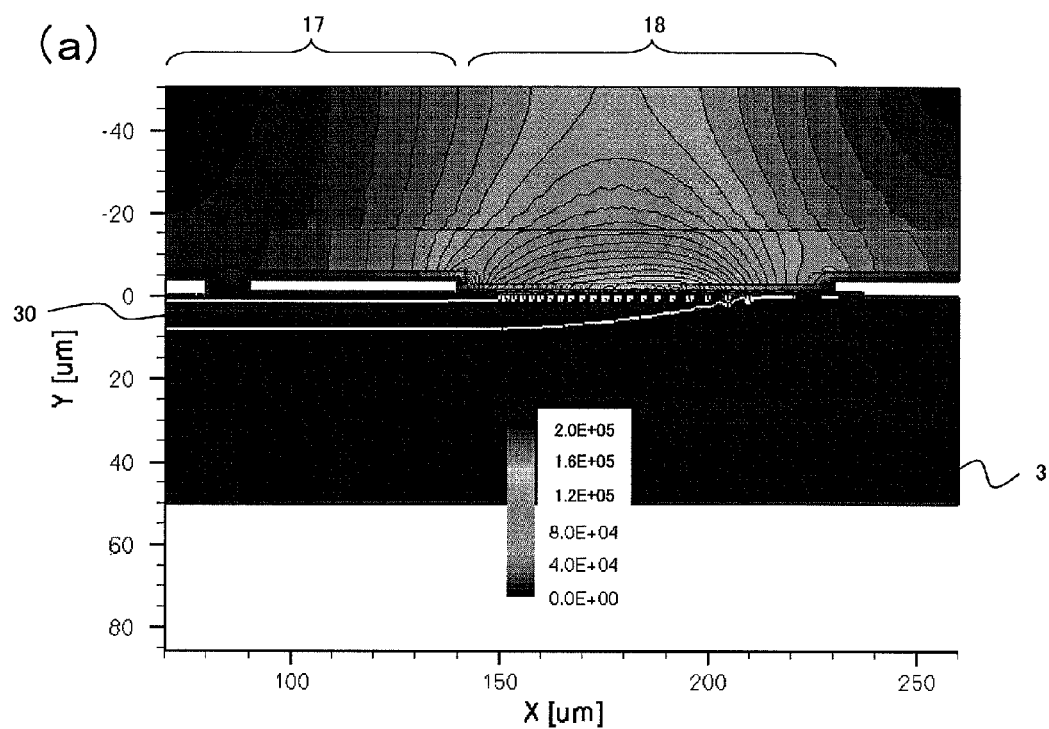
(b)
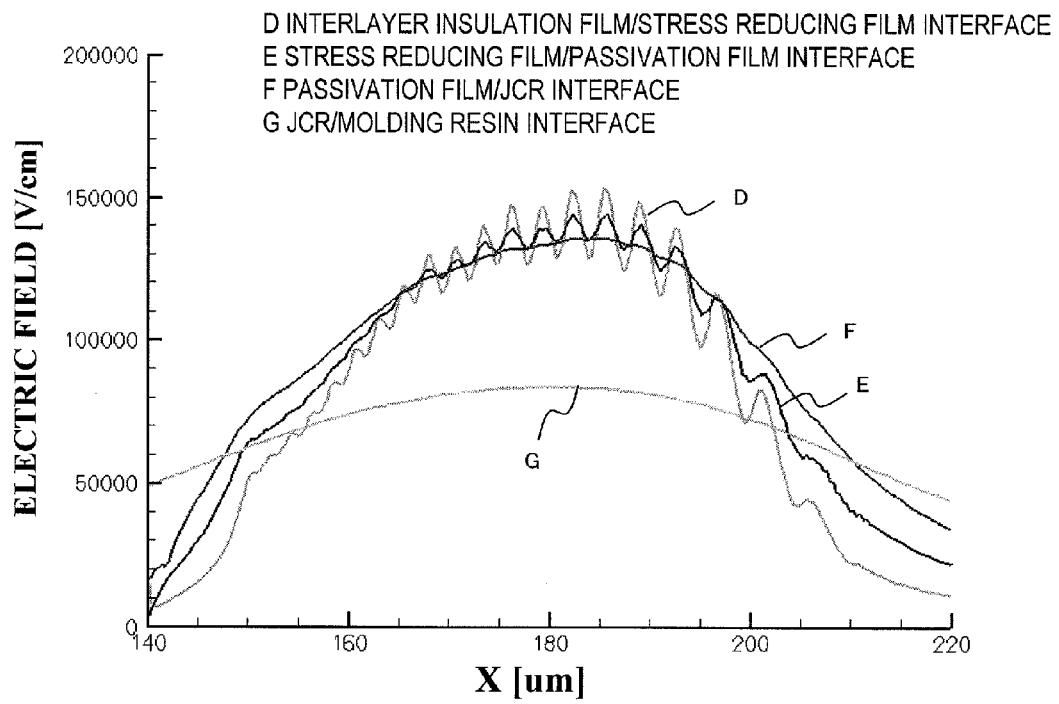

FIG.6
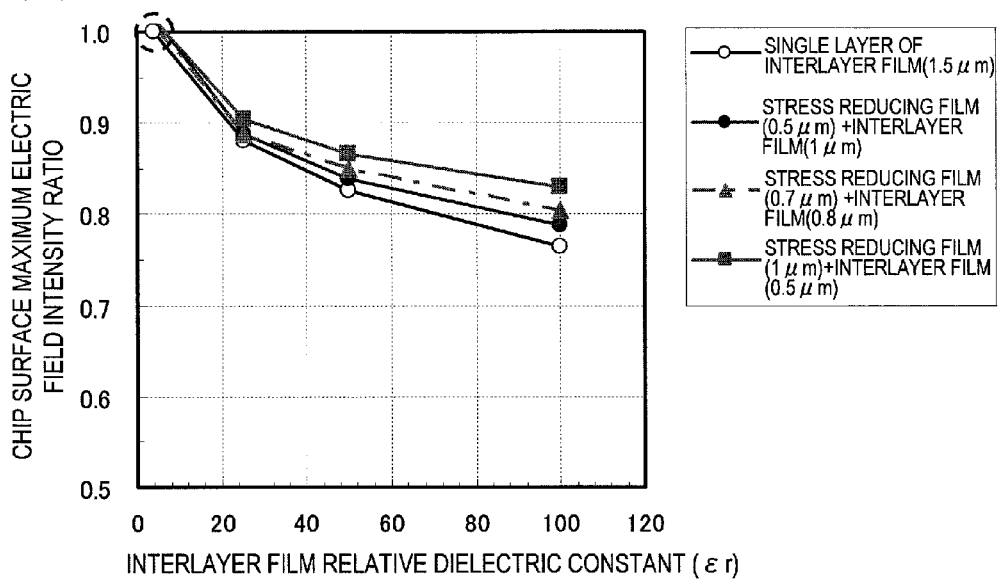
(a)
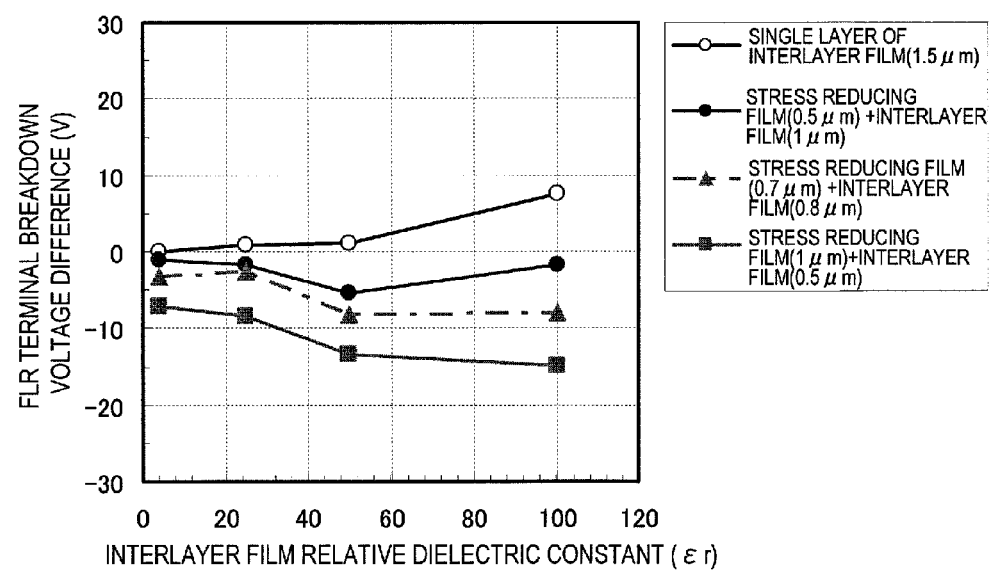
(b)

SEMICONDUCTOR DEVICE AND METHOD FOR PRODUCING SAME

TECHNICAL FIELD

The present invention relates to a semiconductor device and a fabrication method thereof and, specifically, to a silicon carbide based power semiconductor device for high breakdown voltage/large current applications.

BACKGROUND ART

The power semiconductor device is a semiconductor device for use in high breakdown voltage/large current applications, of which low loss operation is demanded. Traditionally, power semiconductor devices built on a silicon (Si) substrate have been in the main stream. In recent years, however, power semiconductor devices built on a silicon carbide (SiC) substrate have been receiving attention, and the development of such devices has been encouraged (see Patent Document 1).

The silicon carbide (SiC) material itself has a higher dielectric breakdown voltage than silicon (Si) by one order of magnitude and therefore has such a characteristic that the breakdown voltage can be maintained even when the thickness of a depletion layer at a pn junction or Schottky junction is decreased. Thus, using SiC enables decreasing the device thickness and increasing the doping density. Therefore, SiC is a promising material for formation of a power semiconductor device which has low on resistance and high breakdown voltage and which is capable of low loss operation.

CITATION LIST

Patent Literature

Patent Document 1: Japanese Laid-Open Patent Publication No. 10-308510
Patent Document 2: Japanese Laid-Open Patent Publication No. 2003-101039
Patent Document 3: Japanese Laid-Open Patent Publication No. 7-131033

SUMMARY OF INVENTION

Technical Problem

The intensity of an electric field that is produced inside a SiC-based power semiconductor device is greater than the intensity of an electric field that is produced inside a Si-based power semiconductor device by a factor of about 10. Usually, the SiC-based power semiconductor device is designed so as to endure such an electric field intensity. However, another large electric field is also produced in a peripheral area of the device, and therefore, if the peripheral area is designed in the same manner as in the Si-based power semiconductor device, there is a probability that dielectric breakdown will occur in that area.

Patent Document 2 proposes a structure shown in FIG. 10, in which a first guard-ring layer 211 that is a p$^+$-type high impurity density layer and a second guard-ring layer 212 that is a p$^-$-type low impurity density layer are provided around an impurity RESURF layer 210, and a metal wire layer 205 which functions as a field plate is provided on the guard-ring layer 211. In this structure, the electric field intensity at the interface between an n$^-$-type semiconductor layer 201 and an insulation film 206 in a terminal portion is reduced so that the breakdown voltage of the device can be improved.

When overmolding the semiconductor device, a polyimide-based coating material (JCR: Junction Coating Resin) or an epoxy-based plastic resin material may sometimes be used as a material for covering the surface of the semiconductor device. The present inventor found that, in the structure shown in FIG. 10, concentration of an electric field in the JCR film (not shown) and the molding resin (not shown) cannot be reduced, and there is a probability that dielectric breakdown will occur in that film or interface.

In the conventional Si-based power semiconductor devices, the deterioration of the electric characteristic (e.g., dielectric breakdown voltage) of the device due to entry of moisture, for example, may sometimes be a problem. Since as previously described the electric field intensity is large in the inside or peripheral area of the SiC-based power semiconductor device, the decrease of the reliability in terms of moisture resistance may be a problem as compared to the case of Si.

Patent Document 3 discloses a structure in which a silicon nitride film is provided on, for example, a channel layer of an insulated gate field effect transistor for the purpose of preventing entry of moisture or impurities from a protection film. The thermal expansion coefficient of the silicon nitride film is relatively close to that of Si, and therefore, when the silicon nitride film is used in the Si-based power semiconductor device, the semiconductor device can be protected from moisture and impurities without causing stress or strain in its surroundings. The present inventor conducted researches and found that, however, when the silicon nitride film is used as a protective insulation film material of the SiC-based power semiconductor device, stress and strain are caused which are attributed to the difference in thermal expansion coefficient between the materials. There is a concern that such stress and strain may produce a crack in the protective insulation film, for example.

The present invention was conceived in view of the above circumstances. One of the major objects of the present invention is to provide a semiconductor device which is protected from moisture, without deteriorating the electric characteristic of the device (e.g., dielectric breakdown voltage), so that stress and strain between the materials used in the device can be decreased, and a method of fabricating the semiconductor device.

Solution to Problem

A semiconductor device of the present invention is a semiconductor device which has a semiconductor element region that is provided in part of a silicon carbide layer and a guard-ring region that is provided in another part of the silicon carbide layer surrounding the semiconductor element region when seen in a direction perpendicular to a principal surface of the silicon carbide layer, the semiconductor device including: an interlayer insulation film which is provided on the principal surface of the silicon carbide layer in the semiconductor element region and the guard-ring region, the interlayer insulation film having a relative dielectric constant of 20 or more; a first protective insulation film provided on the interlayer insulation film in the guard-ring region; and a second protective insulation film provided on the first protective insulation film, wherein the first protective insulation film has a linear expansion coefficient which is between a linear expansion coefficient of a material of the second protective insulation film and a linear expansion coefficient of a material of the interlayer insulation film.

In one embodiment, a difference between the linear expansion coefficient of the material of the first protective insulation film and a linear expansion coefficient of silicon carbide is smaller than a difference between the linear expansion coefficient of the material of the second protective insulation film and the linear expansion coefficient of silicon carbide.

In one embodiment, the first protective insulation film and the second protective insulation film are provided in the guard-ring region, and none of the first protective insulation film and the second protective insulation film is provided in at least part of the semiconductor element region.

In one embodiment, the interlayer insulation film is made of a material selected from a group consisting of a zirconium oxide, a hafnium oxide, and a titanium oxide.

In one embodiment, the first protective insulation film is made of a material selected from a group consisting of an aluminum oxide and an aluminum nitride.

In one embodiment, a total of a thickness of the interlayer insulation film and a thickness of the first protective insulation film is not less than 1.5 µm, and the thickness of the interlayer insulation film is greater than the thickness of the first protective insulation film.

In one embodiment, the second protective insulation film is made of an insulative material which contains a silicon nitride.

In one embodiment, the silicon nitride contained in the second protective insulation film has a linear expansion coefficient which is not less than $2.5 \times 10^{-6}$ and not more than $3.0 \times 10^{-6}/°C$.

In one embodiment, a thickness of the second protective insulation film is not less than 1.5 µm.

In one embodiment, the semiconductor element region includes a diode.

In one embodiment, the semiconductor element region includes a field effect transistor.

A semiconductor device fabrication method of the present invention is a method of fabricating a semiconductor device which has a semiconductor element region that is provided in part of a silicon carbide layer and a guard-ring region that is provided in another part of the silicon carbide layer surrounding the semiconductor element region when seen in a direction perpendicular to a principal surface of the silicon carbide layer, the method including the steps of: forming an interlayer insulation film on the silicon carbide layer in the semiconductor element region and the guard-ring region, the interlayer insulation film having a relative dielectric constant of 20 or more; forming a first protective insulation film on the interlayer insulation film in the guard-ring region; and forming a second protective insulation film on the first protective insulation film, wherein the first protective insulation film has a linear expansion coefficient which is between a linear expansion coefficient of a material of the second protective insulation film and a linear expansion coefficient of a material of the interlayer insulation film.

Advantageous Effects of Invention

According to the present invention, an interlayer insulation film, a first protective insulation film, and a second protective insulation film are provided so that concentration of an electric field at the surface of a semiconductor chip in a guard-ring region can be reduced. In addition, the semiconductor device can be protected from moisture and impurities. Also, occurrence of stress or strain due to the difference in thermal expansion coefficient between the interlayer insulation film and the silicon carbide layer can be prevented.

BRIEF DESCRIPTION OF DRAWINGS

FIGS. 3(a) and 3(b) are cross-sectional views schematically showing 4H—SiC semiconductor models used in a two-dimensional TCAD simulation.

FIG. 4(a) is a diagram of the electric field intensity distribution in a cross section of the structure model shown in FIG. 3(a) (which does not include the first protective insulation film 14). FIG. 4(b) is a graph which shows the electric field intensity in the range of 140 µm to 220 µm over the abscissa axis of FIG. 4(a) (i.e., FLR region).

FIG. 5(a) is a diagram of the electric field intensity distribution in a cross section of the structure model shown in FIG. 3(b) (which includes the first protective insulation film 14). FIG. 5(b) is a graph which shows the electric field intensity in the range of 140 µm to 220 µm over the abscissa axis of FIG. 5(a) (i.e., the terminal guard-ring region 18 of FIG. 1).

FIGS. 6(a) and 6(b) are graphs showing the results of measurement by simulation of the electric field intensity ratio at the semiconductor chip surface and the dielectric breakdown voltage difference.

DESCRIPTION OF EMBODIMENTS

Figure 1:
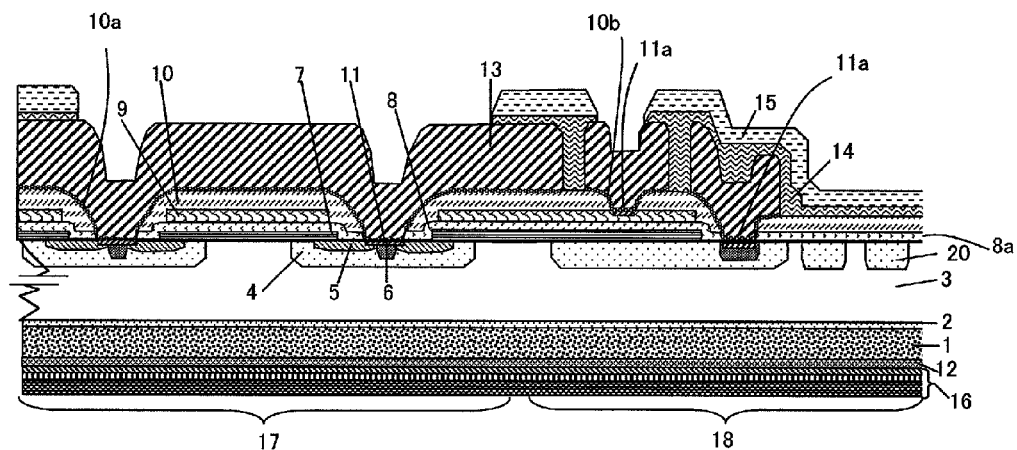
FIG. 1 is a cross-sectional view schematically showing a semiconductor device according to Embodiment 1 of the present invention.

Hereinafter, embodiments of the semiconductor device of the present invention will be described with reference to the drawings. In the drawings which will be referred to below, for simplicity of description, components which have substantially the same functions are denoted by the same reference numerals. Note that the present invention is not limited to the embodiments described below.

Embodiment 1

FIG. 1 is a cross-sectional view schematically showing a semiconductor device according to Embodiment 1 of the present invention.

The semiconductor device of the present embodiment includes a silicon carbide substrate 1, a silicon carbide buffer layer 2 which is provided on the silicon carbide substrate 1, and a silicon carbide drift epitaxial layer 3 (hereinafter, abbreviated as "silicon carbide drift epi-layer) which is provided on the silicon carbide buffer layer 2. The silicon carbide substrate 1, the silicon carbide buffer layer 2, and the silicon carbide drift epi-layer 3 include a Double Implanted Metal-Insulator-Semiconductor Field Effect Transistor (DMISFET) region 17, and a terminal guard-ring region 18 which is provided so as to surround the DMISFET region 17 when seen in a direction perpendicular to the principal surface of the silicon carbide buffer layer 2.

An interlayer insulation film 10 is provided over the principal surface of the silicon carbide drift epi-layer 3 in the DMISFET region 17 and the terminal guard-ring region 18. In the terminal guard-ring region 18, a first protective insulation film 14 is provided on the interlayer insulation film 10, and a second protective insulation film 15 is provided on the first protective insulation film 14.

In the present embodiment, the interlayer insulation film 10, the first protective insulation film 14, and the second protective insulation film 15 are provided such that concentration of the electric field at the surface of the semiconductor chip in the terminal guard-ring region 18 can be reduced. In addition, the semiconductor device can be protected from moisture and impurities. Also, occurrence of stress or strain due to the difference in thermal expansion coefficient from the interlayer insulation film 10 or the silicon carbide buffer layer 2 can be prevented.

Hereinafter, the present embodiment is described more specifically. The semiconductor device of the present embodiment includes the silicon carbide substrate 1 of the first conductivity type, the silicon carbide buffer layer 2 of the first conductivity type which is provided on the principal surface of the silicon carbide substrate 1 and which has a lower dopant density than the silicon carbide substrate 1, and the silicon carbide drift epi-layer 3 of the first conductivity type which is provided on the principal surface of the silicon carbide buffer layer 2 and which has a lower dopant density than the silicon carbide buffer layer 2. In the semiconductor device, the DMISFET region 17 which has a vertical power MISFET structure and the terminal guard-ring region 18 of a FLR (Field Limiting Ring) structure are defined.

In the DMISFET region 17, the surface portion of the silicon carbide drift epi-layer 3 has well regions 4 of the second conductivity type. Inside the well region 4, a source region 5 of the first conductivity type and a body contact region 6 of the second conductivity type are provided. The body contact region 6 is surrounded by the source region 5 when seen in a direction perpendicular to the principal surface of the silicon carbide drift epi-layer 3.

A source ohmic electrode 11 is provided on the body contact region 6 and part of the source region 5 surrounding the body contact region 6. The source ohmic electrode 11 is formed by, for example, an alloy layer of nickel, silicon and carbon or an alloy layer of titanium, silicon and carbon.

In the DMISFET region 17, a silicon carbide channel epitaxial layer 7 (hereinafter, abbreviated as "channel epi-layer") is provided over part of the source region 5, part of the well region 4 surrounding the periphery of the source region 5, and part of the silicon carbide drift epi-layer 3 outside the well region 4. Part of the channel epi-layer 7 extending over the well region 4 functions as the channel of a Metal-Insulator-Semiconductor Field Effect Transistor (MISFET).

A gate insulation film 8 that is made of, for example, a silicon oxide is provided on the channel epi-layer 7. A gate electrode 9 that is formed by, for example, a polysilicon film is provided on the gate insulation film 8.

A gate ohmic electrode 11a is provided on part of the gate electrode 9. The gate ohmic electrode 11a is formed by, for example, an alloy layer of nickel and silicon or an alloy layer of titanium and silicon.

On the other hand, in the terminal guard-ring region 18, the surface portion of the silicon carbide drift epi-layer 3 has a plurality of semiconductor ring regions 20 of the second conductivity type. The semiconductor ring regions 20 have the shape of rings surrounding the DMISFET region 17 when seen in a direction perpendicular to the principal surface of the silicon carbide drift epi-layer 3. The semiconductor ring regions 20 may be formed in the same step as the formation of the well region 4. In this case, the semiconductor ring regions 20 and the well region 4 have equal impurity densities and equal depths.

In the terminal guard-ring region 18, an insulation film 8a is provided over the silicon carbide drift epi-layer 3 and the semiconductor ring regions 20. The insulation film 8a is made of, for example, a silicon oxide. The insulation film 8a may be formed in the same step as the formation of the gate insulation film 8. In this case, the insulation film 8a and the gate insulation film 8 are made of the same material and have equal thicknesses.

The interlayer insulation film 10 is provided over the gate insulation film 8 and the gate electrode 9 in the DMISFET region 17 and over the insulation film 8a in the terminal guard-ring region 18. The relative dielectric constant of the interlayer insulation film 10 is preferably higher than that of a silicon oxide that is commonly used for the interlayer insulation film of the Si-based semiconductor devices. Specifically, the relative dielectric constant of the interlayer insulation film 10 is not less than 20. In this case, occurrence of dielectric breakdown of the JCR at the surface of the semiconductor chip can be prevented. The reasons for this advantage will be described later with reference to FIG. 6(a). Preferred material examples for the interlayer insulation film 10 include a zirconium oxide, a hafnium oxide, and a titanium oxide.

The interlayer insulation film 10 has openings 10a, 10b through which the source ohmic electrode 11 and the gate ohmic electrode 11a are exposed. A pad electrode 13 is provided in the openings 10a, 10b and over the interlayer insulation film 10 that surrounds the openings 10a, 10b. The pad electrode 13 is in contact with the source ohmic electrode 11 and the gate ohmic electrode 11a in the openings 10a, 10b. The pad electrode 13 is formed by a layer of aluminum or aluminum alloy. The pad electrode 13 has a function of electrically coupling the source ohmic electrode 11 and the gate ohmic electrode 11a to an external component.

In the terminal guard-ring region 18, the first protective insulation film (stress reducing film) 14 and the second protective insulation film (passivation film) 15 are provided on the interlayer insulation film 10.

The second protective insulation film 15 is preferably made of a silicon nitride. The thickness of the second protective insulation film 15 is preferably not less than 1.5 μm. This improves the reliability in terms of moisture resistance. When the thickness of the second protective insulation film 15 is not less than 1.5 μm, the total thickness of the interlayer insulation film 10 and the first and second protective insulation films 14, 15 necessarily amounts to 1.5 μm or more. The relationship between the film thickness and the moisture resistance reliability will be described later with reference to FIG. 2.

The thermal expansion coefficient (linear expansion coefficient) of the silicon nitride used for the second protective insulation film 15 is preferably not less than $2.5 \times 10^{-6}/°C$. and not more than $3.0 \times 10^{-6}/°C$. A silicon nitride having a linear expansion coefficient in the range of $2.5 \times 10^{-6}/°C$. to $3.0 \times 10^{-6}/°C$. can be obtained by adjusting the conditions of a CVD method for deposition of the silicon nitride.

The first protective insulation film 14 preferably has a linear expansion coefficient which is between the linear expansion coefficient of the material of the second protective insulation film 15 and the linear expansion coefficient of the material of the interlayer insulation film 10. With such an arrangement, the stress is reduced as compared with a case where the second protective insulation film 15 is in contact with the interlayer insulation film 10.

As described above, the second protective insulation film 15 is made of, for example, a silicon nitride. The linear expansion coefficient of the silicon nitride is close to the linear expansion coefficient of silicon ($2.5 \times 10^{-6}$/° C.). Also, as described above, the interlayer insulation film 10 may be made of, for example, a zirconium oxide, a hafnium oxide, or a titanium oxide. The linear expansion coefficients of the zirconium oxide and the titanium oxide are $1 \times 10^{-5}$/° C. and $6 \times 10^{-6}$/° C., respectively.

Figure 8:
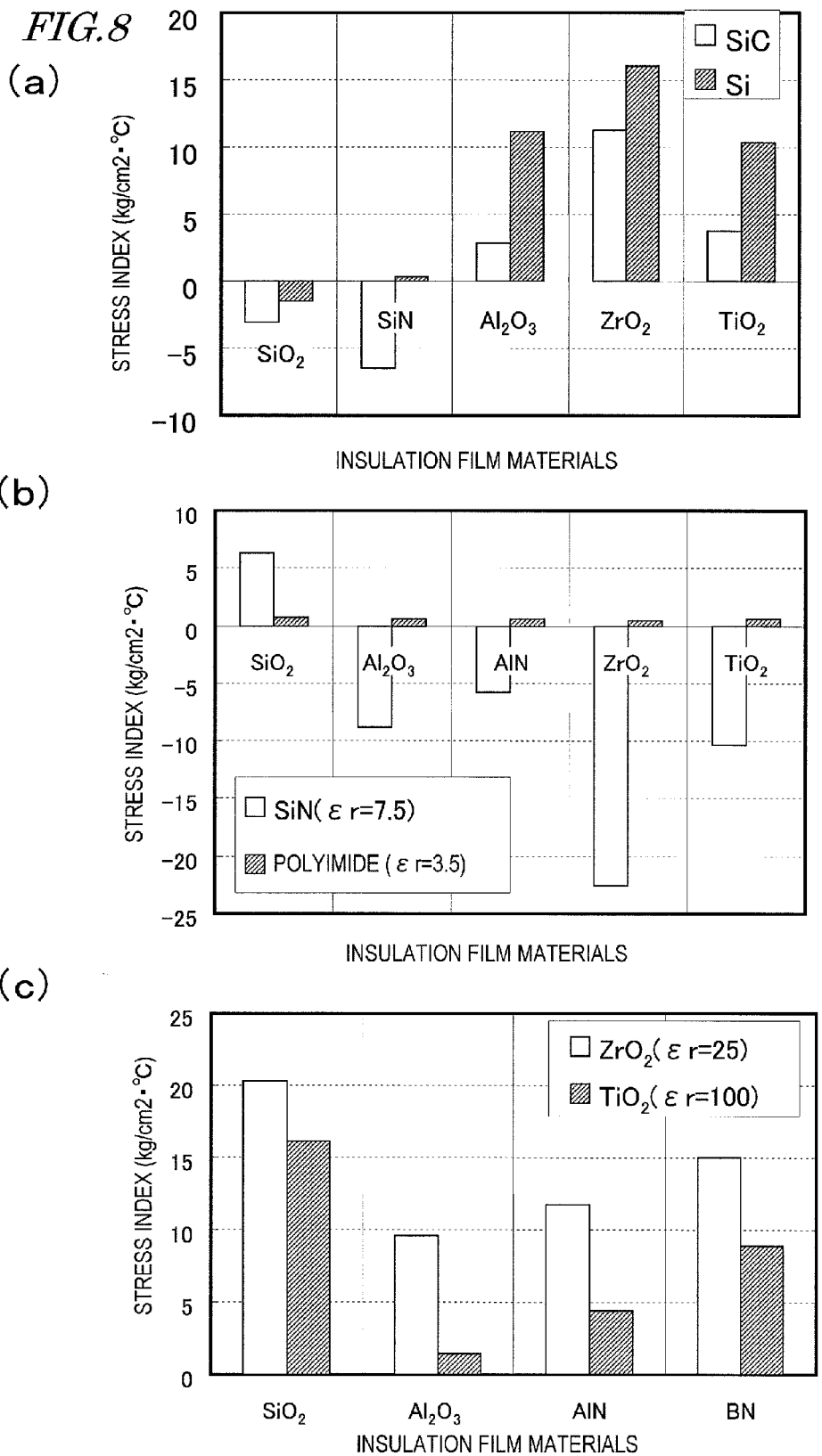
FIGS. 8(a) to 8(c) are graphs which show the results of simplified calculation of the stress index between the respective insulation film materials and the semiconductor materials and the stress index between the respective insulation film materials.

More preferably, the first protective insulation film 14 is made of an insulation film material which has a linear expansion coefficient of $(4.5 \pm 1) \times 10^{-6}$/° C. For example, the first protective insulation film 14 is preferably made of an aluminum oxide (linear expansion coefficient: $5.5 \times 10^{-6}$/° C.) or an aluminum nitride (linear expansion coefficient: $4.5 \times 10^{-6}$/° C.). The stress index between the zirconium oxide or titanium oxide and the silicon nitride is smaller than the stress index between the aluminum oxide or aluminum nitride and the silicon nitride. This is shown in FIG. 8(b) and will be described later.

Preferably, the difference between the linear expansion coefficient of the material of the first protective insulation film 14 and the linear expansion coefficient of silicon carbide is smaller than the difference between the linear expansion coefficient of the material of the second protective insulation film 15 and the linear expansion coefficient of the material of silicon carbide. As described above, for example, the second protective insulation film 15 is made of a silicon nitride, and the first protective insulation film 15 is made of an aluminum oxide or aluminum nitride. As seen from FIG. 8(a), the stress index between the aluminum oxide and SiC is smaller than the stress index between the silicon nitride and SiC. This will be described later.

The first protective insulation film 14 and the second protective insulation film 15 are provided only in the terminal guard-ring region 18 and are not provided in part of the DMISFET region 17. Specifically, these films are not provided over regions in the DMISFET region 17 which are to form a source pad and a gate pad for electric connection to external components. The thickness of the first protective insulation film 14 is preferably smaller than the thickness of the interlayer insulation film 10. When the thickness of the first protective insulation film 14 is smaller than the thickness of the interlayer insulation film 10, concentration of the electric field intensity at the surface of the semiconductor chip can be reduced while preventing the decrease of the FLR dielectric breakdown voltage. The simulation results that verify this fact will be described in a later section with reference to FIGS. 6(a) and 6(b).

The opposite side of the silicon carbide substrate 1 is provided with a opposite side electrode 16, with a drain ohmic electrode 12 interposed therebetween. The drain ohmic electrode 12 is formed by, for example, an alloy layer of nickel, silicon and carbon or an alloy layer of titanium, silicon and carbon, as is the source ohmic electrode 11. The opposite side electrode 16 has a multilayer structure of, for example, titanium/nickel/silver from the silicon carbide substrate 1 side.

In one example of the present embodiment, the first conductivity type is n-type. The silicon carbide substrate 1 shown in FIG. 1 is an n-type SiC semiconductor substrate ($n^+$SiC substrate), the silicon carbide buffer layer 2 is an $n^-$ layer, and the silicon carbide drift epi-layer 3 is an $n^{--}$ layer. The well region 4 is a $p^-$ layer, the source region 5 is an $n^+$ layer, and the body contact region 6 is a $p^+$ layer. Note that the signs "+" and "−" denote the relative density of an n-type or p-type dopant.

The channel epi-layer 7 of the present embodiment is an insulative layer (or substantially insulative layer), which is sometimes referred to as "i-layer" or "channel epi i-layer". It should be, however, noted that a channel epi-layer 30 may be a lightly-doped, first conductivity type ($n^-$) layer. The channel epi-layer 30 may have a variation in doping density along the depth direction.

The $n^+$SiC substrate 1 is made of hexagonal silicon carbide. The thickness of the $n^+$SiC substrate 1 is, for example, 250 µm to 350 µm. The doping density of the $n^+$SiC substrate 1 is, for example, 8E18 cm$^{-3}$. Here, 8E18 cm$^{-3}$ means $8 \times 10^{18}$ cm$^{-3}$. Hereinafter, in this specification, the doping density is sometimes expressed in the same way. Note that, in the case of the $n^+$SiC substrate 1, a substrate which is made of a cubic silicon carbide may be used.

The SiC buffer layer 2 and the SiC drift epi-layer are SiC layers epitaxially formed over the principal surface of the SiC substrate 1. The doping density of the SiC buffer layer 2 is, for example, 6E16 cm$^{-3}$. The thickness of the SiC drift epi-layer 3 is, for example, 4 µm to 15 µm. The doping density of the SiC drift epi-layer 3 is, for example, 5E15 cm$^{-3}$.

The thickness of the well region 4 (i.e., the depth from the upper surface of the SiC drift epi-layer 3) is, for example, 0.5 µm to 1.0 µm. The doping density of the well region 4 is, for example, 1.5E18 cm$^{-3}$. The thickness of the source region 5 (i.e., the depth from the upper surface of the SiC drift epi-layer 3) is, for example, 0.25 µm. The doping density of the source region 5 is, for example, 5E19 cm$^{-3}$. The thickness of the body contact layer ($p^+$ layer) 6 is, for example, 0.3 µm. The doping density of the body contact layer 6 is, for example, 2E20 cm$^{-3}$. Note that, in the DMISFET region 17, part of the SiC drift epi-layer 3 extending between the well regions 4 is defined as a Junction Field Effect Transistor (JFET) region. The length (width) of the JFET region is, for example, 3 µm.

The channel epi-layer 7 is, for example, a 30 nm to 150 nm thick SiC layer which is epitaxially formed on the SiC drift epi-layer 3. The length (width) of the channel region is, for example, 0.5 µm. The gate insulation film 8 is formed by, for example, a 70 nm thick SiO$_2$ film (silicon oxide). The gate electrode 9 is formed by, for example, a 500 nm thick poly-Si (polysilicon).

The source ohmic electrode 11 and the drain ohmic electrode 12 are each formed by, for example, a 50 nm to 100 nm thick layer which is made of an alloy of nickel, silicon and carbon or an alloy of titanium, silicon and carbon. Depositing nickel and silver, or nickel and gold, as the opposite side electrode 16 facilitates soldering in the process of mounting the SiC chip to a plastic resin package.

Figure 2:
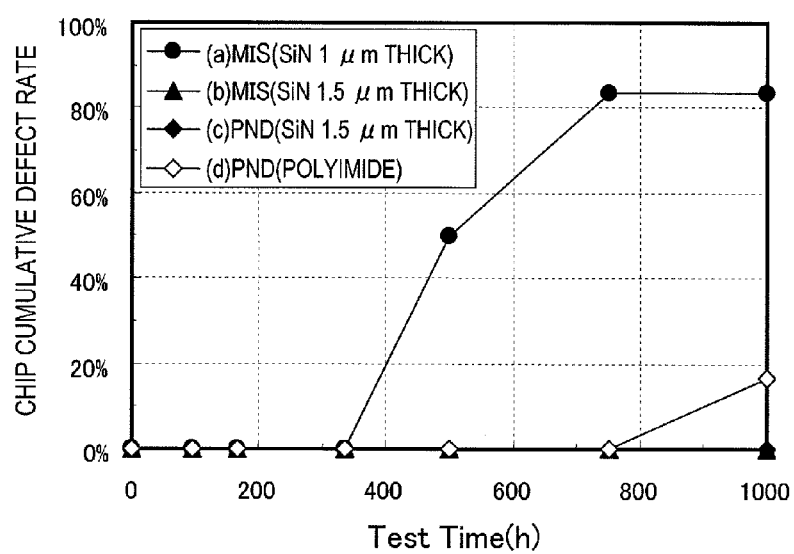
FIG. 2 is a graph which shows the results of a Thermal and Humidity Bias (THB) test.

Next, the result of an examination for materials suitable to the second protective insulation film 15 is described. FIG. 2 is a graph which shows the results of a Thermal and Humidity Bias (THB) Test. This test was carried out using four samples where the protection film that covers the FLR has different thicknesses and is made of different materials. Specifically, sample (a) where the FLR of a chip which has a DMISFET is covered with a 1 µm thick silicon nitride, sample (b) where the FLR of a chip which has a DMISFET is covered with a 1.5 µm thick silicon nitride, sample (c) where the FLR of a chip which has a pn junction diode is covered with a 1.5 µm thick silicon nitride, and sample (d) where the FLR of a chip which has a pn junction diode is covered with a 2 µm thick polyimide were used. The test was carried out with these chips being overmolded with a polyimide JCR or an epoxy resin material into an full-molded TO-220 package.

The abscissa axis of FIG. 2 represents the test time (h), and the ordinate axis represents the cumulative failure rate of each sample. The test conditions were, commonly, the bias voltage V=1050 V, the ambient temperature Ta=85° C., and the relative humidity at 85% RH.

As seen from FIG. 2, the cumulative failure rate of either sample was approximately 0 before around the 340th hour of the test time. However, after the 340th hour, the cumulative failure rate of sample (a) increased. The cumulative failure rate of samples (b) and (c) was maintained approximately 0 even at the 1000th hour of the test time. It is appreciated from these results that, when a silicon nitride is used for the second protective insulation film 15, it is preferred that the thickness of the silicon nitride is not less than 1.5 µm. On the other hand, in sample (d) of polyimide, the cumulative failure rate increased after the test time passed the 750th hour. It is appreciated from this result that, when a 2 µm thick polyimide is used for the second protective insulation film 15, the reliability in terms of moisture resistance is insufficient.

Next, the result of an examination as to the electric field distribution and the breakdown voltage for the respective layers of the semiconductor device through a TCAD (Technology Computer Aided Design) simulation is described.

FIGS. 3(a) and 3(b) are cross-sectional views schematically showing 4H—SiC semiconductor models used in the two-dimensional TCAD simulation. FIG. 3(a) shows a structure model which includes an interlayer insulation film 110 and a second protective insulation film (passivation film) 115 but which does not include the first protective insulation film (stress reducing film) 14 shown in FIG. 1. In FIG. 3(a), a second conductivity type well region 104 is provided in part of a silicon carbide drift epi-layer 103 which is within a device formation region 117, and second conductivity type semiconductor ring regions 120 are provided in a terminal guard-ring region 118. The interlayer insulation film 110 is provided over the silicon carbide drift epi-layer 103, and a pad electrode 113 is provided on the interlayer insulation film 110 in the device formation region 117. Although not shown, the interlayer insulation film 110 has an opening in which the pad electrode 113 is coupled to the source ohmic electrode and the gate ohmic electrode. A protective insulation film 115 is provided over the interlayer insulation film 110, and a JCR 119 is provided over the protective insulation film 115. A opposite side electrode 116 is provided over the opposite side of the silicon carbide drift epi-layer 103. As the interlayer insulation film 110, a 1.5 µm thick silicon oxide (relative dielectric constant: 3.9) was used. As the second protective insulation film 115, a 1.5 µm thick silicon nitride (relative dielectric constant: 7) was used. The voltage between the drain and the source of the MISFET device, Vds, was 600 V.

FIG. 3(b) shows a structure model which includes the interlayer insulation film 10 that has a higher relative dielectric constant than silicon oxide, the first protective insulation film 14, and the second protective insulation film 15. As the interlayer insulation film 10, a 0.5 µm thick titanium oxide (relative dielectric constant: 100) was used. As the first protective insulation film 14, a 1 µm thick aluminum oxide or aluminum nitride was used. The relative dielectric constant (∈r) of the first protective insulation film 14 was 9 (constant). In FIG. 3(b), components which are the same as those of FIG. 1 are denoted by the same reference numerals. Here, the descriptions of the components which are the same as those of FIG. 1 are omitted.

FIG. 4(a) is a diagram of the electric field intensity distribution in a cross section of the model shown in FIG. 3(a) (which does not include the first protective insulation film 14). In FIG. 4(a), the abscissa axis and the ordinate axis represent the relative position in the chip. In FIG. 4(a), the electric field intensity is expressed by the gradation of the lightness. On the other hand, FIG. 5(a) is a diagram of the electric field intensity distribution in a cross section of the structure model shown in FIG. 3(b) (which includes the second protective insulation film 14). Comparing FIG. 4(a) and FIG. 5(a), a high electric field region 30 of the silicon carbide drift epi-layer 3 of FIG. 5(a) has a greater expanse toward the terminal guard-ring region 18 than a high electric field region 130 of the silicon carbide drift epi-layer 103 of FIG. 4(a). This is probably because the relative dielectric constant of the interlayer insulation film 10 of FIG. 3(b) is greater than the relative dielectric constant of the interlayer insulation film 110 of FIG. 3(a) so that, in the structure shown in FIG. 3(b), the electric field at the surface of the silicon carbide drift epi-layer 3 can be dispersed. Since the electric field in the silicon carbide drift epi-layer 3 can be dispersed in this way, it is expected that the electric fields at the interfaces of the respective layers of the FLR region (the interlayer insulation film 10, the first protective insulation film 14 and the second protective insulation film 15, the JCR 19) can be dispersed.

FIG. 4(b) is a graph which shows the electric field intensity in the range of 140 µm to 220 µm over the abscissa axis of FIG. 4(a) (i.e., FLR region). FIG. 4(b) shows the electric field intensity A at the interface between the second protective insulation film 115 and the interlayer insulation film 110, the electric field intensity B at the interface between the second protective insulation film 115 and the JCR 119, and the electric field intensity C at the interface between the JCR 119 and an overmolding resin provided thereover (not shown). On the other hand, FIG. 5(b) is a graph which shows the electric field intensity in the range of 140 µm to 220 µm over the abscissa axis of FIG. 5(a) (i.e., the terminal guard-ring region 18 of FIG. 1). FIG. 5(b) shows the electric field intensity D at the interface between the interlayer insulation film 10 and the first protective insulation film 14, the electric field intensity E at the interface between the first protective insulation film 14 and the second protective insulation film 15, the electric field intensity F at the interface between the second protective insulation film 15 and the JCR 19, and the electric field intensity G at the interface between the JCR 19 and an overmolding resin provided thereover (not shown).

Comparing FIG. 4(b) and FIG. 5(b), the peak values of curves A and B in FIG. 4(b) are in the region of 0.17 to 0.19 (MV/cm), whereas the peak values of curves D, E and F in FIG. 5(b) are in the region of 0.15 (MV/cm). For example, the maximum electric field intensity at the interface between the passivation film and the JCR is about 0.17 (MV/cm) in curve B, and about 0.135 (MV/cm) in curve F. It was thus confirmed that, in the present embodiment, the maximum electric field intensity at this interface can be reduced by 20% or more.

The change of the value of the electric field intensity is more moderate in curves D, E and F than in curves A and B. It was verified by these results that, in the structure shown in FIG. 3(b), the electric field intensity at the interfaces of the respective layers of the FLR region can be greatly reduced as compared with the structure shown in FIG. 3(a).

Next, the results of an examination as to the thicknesses of the interlayer insulation film 10 and the first protective insulation film (stress reducing film) 14 are described. FIGS. 6(a) and 6(b) are graphs showing the results of measurement by simulation of the electric field intensity ratio at the semiconductor chip surface and the dielectric breakdown voltage difference. FIGS. 6(a) and 6(b) show the simulation results of four samples among which the thicknesses of the first protective insulation film 14 and the interlayer insulation film 10 are different.

The abscissa axis of FIG. 6(a) represents the relative dielectric constant (∈r) of the interlayer insulation film 10, and the ordinate axis represents the maximum electric field intensity at the chip surface (the interface between the second protective insulation film 15 and the JCR 19) where the maximum electric field intensity value in the structure shown in FIG. 3(a) is assumed as 1.

In the samples in which the thickness of the first protective insulation film 14 is smaller than that of the interlayer insulation film 10 (●, ▲), the decrease of the ratio of the maximum electric field intensity is greater than in the sample in which the thickness of the first protective insulation film 14 is greater than that of the interlayer insulation film 10 (■). The respective samples are configured such that the total of the thickness of the interlayer insulation film 10 and the thickness of the first protective insulation film 14 is 1.5 μm.

It is appreciated from this result that, when the total of the thickness of the interlayer insulation film 10 and the thickness of the first protective insulation film 14 is constant, the electric field intensity at the semiconductor chip surface can be further reduced by making the thickness of the first protective insulation film 14 smaller than that of the interlayer insulation film 10.

As seen from FIG. 6(a), the ratio of the maximum electric field intensity decreases as the value of the relative dielectric constant of the interlayer insulation film 10 increases. To prevent dielectric breakdown of the JCR at the chip surface, it is preferable to maintain the maximum electric field intensity ratio at the chip surface equal to or smaller than 0.9 in FIG. 6(a) (which is equivalent to the electric field intensity value of 0.15 MV/cm (absolute value)). In view of this, the relative dielectric constant (∈r) of the interlayer insulation film 10 preferably has such a value that the maximum electric field intensity ratio is equal to or smaller than 0.9, i.e., a value not less than 20. Note that, as described above, the thickness of the first protective insulation film 14 is preferably smaller than that of the interlayer insulation film 10. Therefore, in the samples which meet this condition (●, ▲), the relative dielectric constant is not less than 20 such that the maximum electric field intensity ratio is equal to or smaller than 0.9.

The abscissa axis of FIG. 6(b) represents the relative dielectric constant (∈r) of the interlayer insulation film 10, and the ordinate axis represents the dielectric breakdown voltage difference at the terminal structure (FLR) portion. The "breakdown voltage difference" refers to the value of the breakdown voltage relative to the breakdown voltage value of the structure shown in FIG. 3(a) which is assumed as 0 (reference value). In the respective samples of FIG. 6(b), the total of the thickness of the interlayer insulation film 10 and the thickness of the first protective insulation film 14 is adjusted to 1.5 μm. As seen from FIG. 6(b), at any of the relative dielectric constant values of the interlayer insulation film 10, the sample which does not include the first protective insulation film 14 (○) exhibits the largest breakdown voltage difference value. The value of the breakdown voltage difference decreases as the ratio of the thickness of the interlayer insulation film 10 to the thickness of the first protective insulation film 14 increases.

As seen from FIG. 6(b), when the total of the thickness of the interlayer insulation film 10 and the thickness of the first protective insulation film 14 is constant and the thickness of the interlayer insulation film 10 is smaller than that of the first protective insulation film 14, the FLR dielectric breakdown voltage is more likely to decrease (by 10 V or more from the reference value). It is appreciated from this result that the decrease of the breakdown voltage can be prevented by making the thickness of the first protective insulation film 14 smaller than the thickness of the interlayer insulation film 10.

As previously described with reference to FIG. 2, in order to improve the reliability in terms of moisture resistance, it is preferable to use a silicon nitride having a thickness of 1.5 μm or more. However, the thermal expansion coefficient of silicon nitride and the thermal expansion coefficient of silicon carbide are different, and therefore, it is expected that stress and strain occur when a silicon carbide layer and a film of silicon nitride are in contact with each other. In view of such, the stress and strain can be reduced by providing a predetermined insulation film between the silicon carbide layer and the film of silicon nitride.

Figure 7:
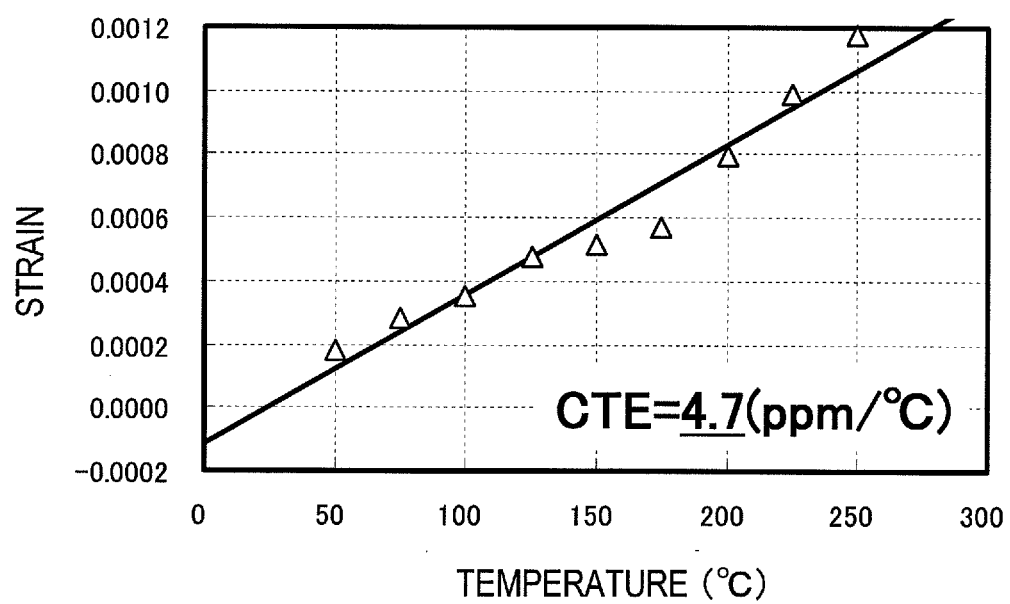
FIG. 7 is a graph which shows actual measurements of the linear expansion coefficient of the 4H—SiC semiconductor chip.

The insulation film materials which cause small stress and strain between themselves and SiC, silicon nitride, etc., were examined in terms of a simplified stress index (the product of the difference in linear expansion coefficient between materials and the elastic modulus). Prior to the examination, the linear expansion coefficient of a 4H—SiC substrate piece in the shape of a 12 mm×12 mm square was actually measured according to a 3D stereo measurement method with the use of a high definition CCD camera, which is called DIC (Digital Image Correlation). The results of the measurement are shown in FIG. 7. The measurements shown in FIG. 7 were obtained at temperatures in the range of room temperature (25° C.) to 250° C. As a result, the linear expansion coefficient of 4H—SiC was $4.7 \times 10^{-6}/°$ C. This physical property value was used to calculate the stress index. The results of the calculation are shown in FIGS. 8(a) to 8(c).

FIG. 8(a) shows the calculation results of the stress index between SiC or Si and the respective insulation film materials. In FIG. 8(a), a "positive" stress index value represents a stress from the insulation film material onto SiC (or Si), and a "negative" stress index value represents a stress from SiC (or Si) onto the insulation film material. It is appreciated that suitable insulation film materials which provide decreased stress indices vary depending on whether they are used with SiC or Si because of the difference in linear expansion coefficient between the semiconductor materials (SiC: $4.7 \times 10^{-6}/°$ C., Si: $2.5 \times 10^{-6}/°$ C.). For example, as previously described, in the case of silicon nitride (SiN) which is a material of high moisture resistance, the stress index between silicon nitride and Si is low, but the stress index between silicon nitride and SiC is high. When a film made of silicon nitride and a SiC film are stacked, the probability of occurrence of strain between the materials is high. On the other hand, aluminum oxide ($Al_2O_3$) exhibits the opposite tendency to SiN. The stress index between aluminum oxide and Si is high, but the stress index between aluminum oxide and SiC is low. The stress index between aluminum oxide and SiC is lower than the stress index between silicon nitride and SiC. Thus, stacking an aluminum oxide and a SiC film is more effective in reducing the stress and strain than stacking a silicon nitride and a SiC film.

FIG. 8(b) shows the calculation results of the stress index between SiN or polyimide and the respective insulation film materials. It is appreciated that the stress index between $Al_2O_3$ or aluminum nitride (AlN) and SiN is much lower than the stress index between $ZrO_2$ which has a high relative dielectric constant (∈r=about 25) and SiN. It is seen that the stress index between $Al_2O_3$ or aluminum nitride (AlN) and SiN is much lower than the stress index between $TiO_2$ and SiN. It is appreciated from these results that, when SiN and zirconium oxide ($ZrO_2$) or $TiO_2$ are stacked, large stress and strain occur between the insulation film materials.

FIG. 8(c) shows the calculation results of the stress index between $ZrO_2$ or titanium oxide ($TiO_2$) and the respective insulation film materials. It is appreciated that, as in FIG. 8(b), in the case of either of $ZrO_2$ and $TiO_2$, the stress and strain between the insulation film materials can be reduced when $Al_2O_3$ or AlN is used.

Based on these examination results, the present inventor found the optimum combinations of the materials for the interlayer insulation film 10, the first protective insulation film 14 and the second protective insulation film 15.

According to the present embodiment, the reliability in terms of moisture resistance can be improved by using a silicon nitride having a thickness of 1.5 µm or more as the second protective insulation film 15. The stress which occurs in the semiconductor chip can be reduced by using, for the first protective insulation film 14, a material which has a linear expansion coefficient between the linear expansion coefficient of the material of the second protective insulation film 15 and the linear expansion coefficient of the material of the interlayer insulation film 10. The material which has a linear expansion coefficient between the linear expansion coefficient of the material of the second protective insulation film 15 and the linear expansion coefficient of the material of the interlayer insulation film 10 may be aluminum oxide or aluminum nitride. As seen from the results shown in FIG. 8(b), a stress which occurs when these films and a film made of silicon nitride are stacked is relatively small. By using a film whose relative dielectric constant is higher than that of silicon oxide as the interlayer insulation film 10, the electric field produced at the surface of the semiconductor chip can be dispersed. Thereby, occurrence of dielectric breakdown can be avoided. Specifically, a material whose relative dielectric constant is 20 or more is preferably used. Examples of such a material include zirconium oxide, hafnium oxide, and titanium oxide. As seen from the results shown in FIG. 8(c), the stress between these materials and aluminum oxide or aluminum nitride which forms the first protective insulation film 14 is relatively small. Thus, even when these materials are used, the increase of the stress in the semiconductor chip can be prevented.

Embodiment 2

Hereinafter, a method of fabricating the semiconductor device of Embodiment 1 is described with reference to FIGS. 9(a) to 9(f). FIGS. 9(a) to 9(f) are cross-sectional views which illustrate the steps for fabricating the semiconductor device of Embodiment 1.

Figure 9:
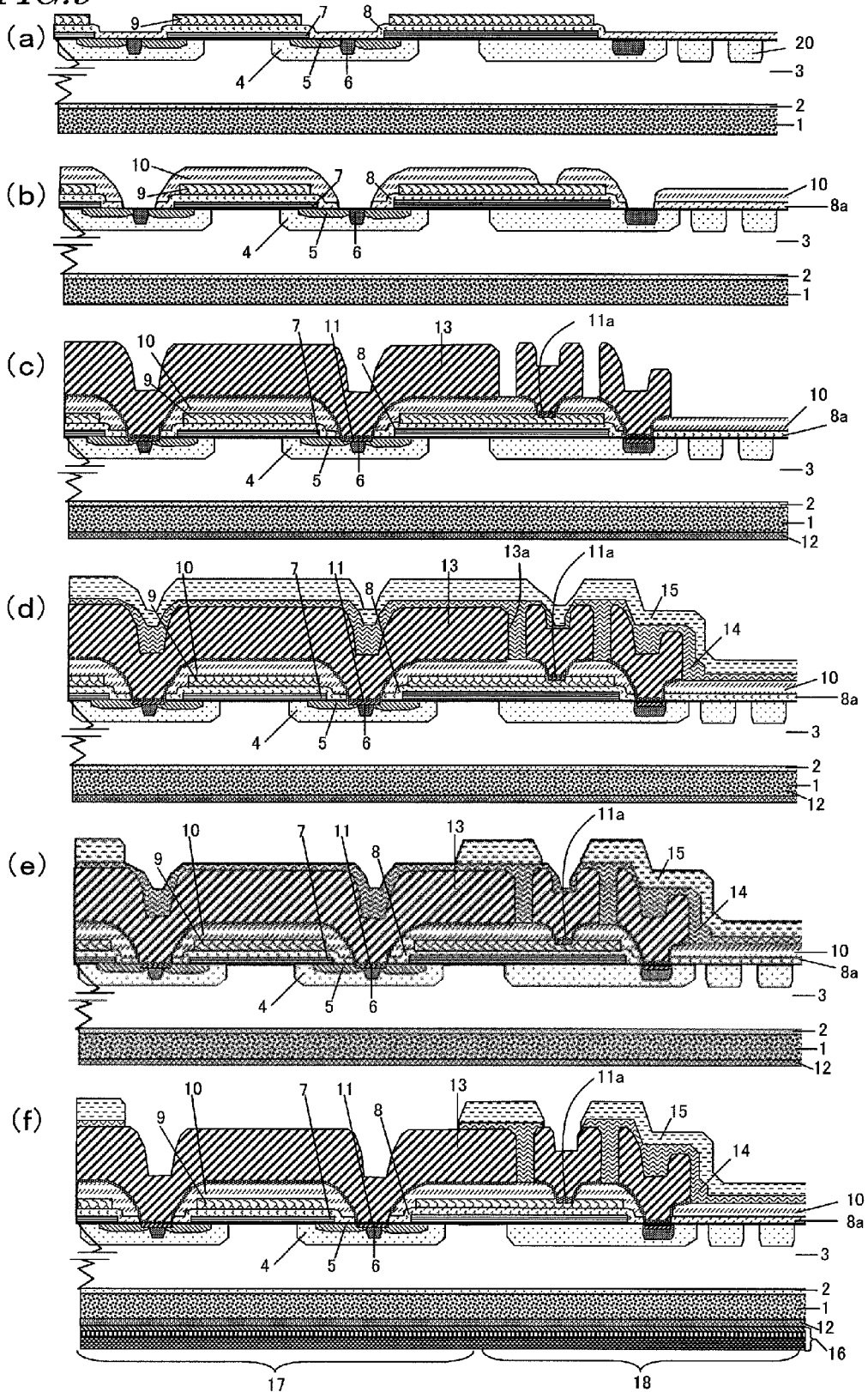
FIGS. 9(a) to 9(f) are diagrams which illustrate the fabrication steps of the semiconductor device of Embodiment 1.
Figure 10:
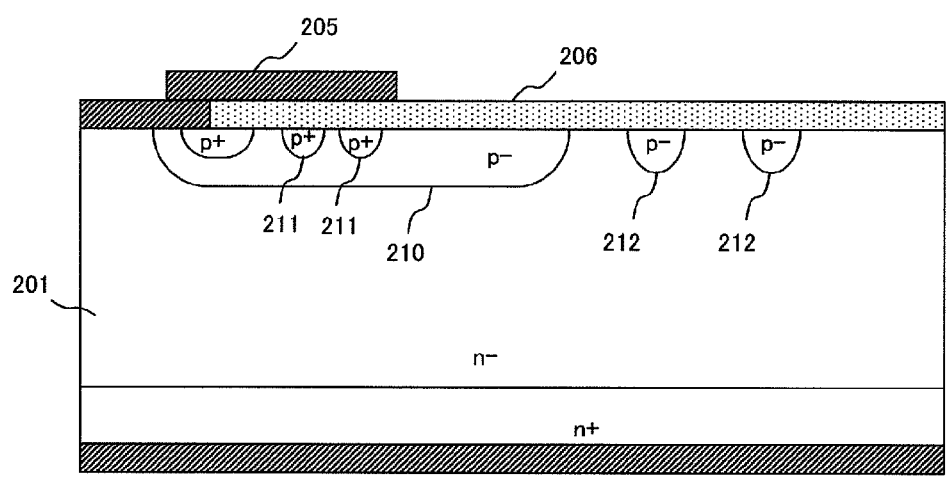
FIG. 10 is a cross-sectional view showing a conventional semiconductor device.

First, a fabrication method for realizing the structure shown in FIG. 9(a) is described. As the $n^+SiC$ substrate 1, an n-type 4H—SiC (0001) substrate is provided. For example, this substrate has an off-cut surface by 8° or 4° in <11-20> direction, and its n-type doping density is $1×10^{18}$ $cm^{-3}$ to $5×10^{19}$ $cm^{-3}$.

Then, on the principal surface of the $n^+SiC$ substrate 1, an $n^-$ buffer layer 2 and an $n^{--}$ drift epi-layer 3 are sequentially deposited by epitaxial growth. The epitaxial growth is realized by, for example, thermal CVD with the use of silane ($SiH_4$) and propane ($C_3H_8$) as the source gas, hydrogen ($H_2$) as the carrier gas, and a nitrogen ($N_2$) gas as the dopant gas. As a result, the $n^-$ buffer layer 2 which has an impurity density of 6E16 $cm^{-3}$ and which has a thickness of 4 µm or more and the $n^{--}$ drift epi-layer 3 which has an impurity density of $1×10^{15}$ $cm^{-3}$ to $1×10^{16}$ $cm^{-3}$ and which has a thickness of 4 µm or more are formed.

Then, a predetermined mask which defines the well regions 4 (e.g., a mask made of an oxide) is provided over the $n^{--}$ drift epi-layer 3, and ion implantation of, for example, $Al^+$ is performed to form the well regions ($p^-$) 4 and the semiconductor ring regions 20 which have a predetermined thickness at the surface portion of the $n^{--}$ drift epi-layer 3. The ion implantation is performed through a plurality of separate cycles, with the energy of 30 keV to 350 keV, while the temperature of the substrate is maintained at, for example, 500° C. The depth of the well regions 4 is, for example, 0.5 µm to 1.0 µm. Part of the $n^{--}$ drift epi-layer 3 extending between the well regions 4 forms a JFET region. The width of the JFET region is, for example, 3 µm.

Then, a predetermined mask which defines the source regions 5 is provided, and ion implantation of $N^+$ (nitrogen ion) or $P^+$ (phosphorus ion) is performed to form source regions ($n^{++}$) 5 which have a depth of, for example, 0.25 µm at the surface of the well regions ($p^-$) 4. The ion implantation is performed through a plurality of separate cycles, with the energy of 30 keV to 90 keV, while the temperature of the substrate is maintained at, for example, 500° C.

Then, a predetermined mask which defines the body contact regions 6 is provided, and ion implantation of $Al^+$ (aluminum ion) or $B^+$ (boron ion) is performed to form body contact regions ($p^+$ layer) 6 at the surface of the well regions ($p^-$) 4. The ion implantation is performed through a plurality of separate cycles, with the energy of 30 keV to 150 keV, while the temperature of the substrate is maintained at, for example, 500° C. The depth of the body contact regions ($p^+$ layer) 6 is greater than that of the source regions ($n^{++}$) 5 and is, for example, 0.3 µm.

Then, activation annealing at a temperature not less than 1000° C., for example, around 1700° C., is performed on the silicon carbide substrate 1 (more exactly, the silicon carbide substrate 1 in which the $n^-$ buffer layer 2, the $n^{--}$ drift epi-layer 3, the well regions ($p^-$) 4, the source regions 5 and the body contact regions ($p^+$ layer) 6 have been formed), whereby implanted ion species are activated.

Then, a channel epi-layer 7 is deposited by epitaxial growth. The channel epi-layer 7 of the present embodiment is an epi i-layer which is made of SiC. The epitaxial growth may be realized by, for example, thermal CVD with the use of silane ($SiH_4$) and propane ($C_3H_8$) as the source gas, hydrogen ($H_2$) as the carrier gas, and a nitrogen ($N_2$) gas as the dopant gas. As a result, the channel epi-layer 7 which has an impurity density of $1×10^{15}$ $cm^{-3}$ to $5×10^{15}$ $cm^{-3}$ and which has a thickness of 30 nm to 150 nm is formed.

Note that nitrogen ($N_2$) gas may be introduced in the middle of the epitaxial growth to increase the impurity density in part of the channel epi-layer 7. The surface of the epitaxially-grown channel epi-layer 7 may be removed by CMP (chemical mechanical polishing).

Then, the channel epi-layer 7 is patterned by dry etching via a predetermined mask. Thereafter, for example, a 70 nm thick gate insulation film ($SiO_2$) 8 is formed over the patterned channel epi-layer 7.

Then, a gate electrode (poly-Si) 9 is formed on the gate oxide film 8 by low-pressure CVD. Thereafter, the gate electrode 9 is patterned by etching using a predetermined mask. Through the above process, the structure shown in FIG. 9(a) is obtained.

Thereafter, the steps illustrated in FIGS. 9(b) to 9(f) for forming a protective insulation film and wires are performed.

First, as shown in FIG. 9(b), an interlayer insulation film 10 is formed over the gate electrode 9 and the gate insulation film 8 and over the source region 5 and the body contact region ($p^+$ layer) 6 of the drift epi-layer 3. As the interlayer insulation film 10, an insulation film material which has a higher dielectric constant than silicon oxide, e.g., an oxide of zirconium ($ZrO_2$), an oxide of hafnium ($HfO_2$), an oxide of titanium ($TiO_2$), or a multilayer film thereof, is used. The interlayer insulation film 10 is formed by, for example, MOCVD or sputtering so as to have a thickness of about 500 nm to 1500 nm. The thickness of the interlayer insulation film 10 is, more preferably, not less than 600 nm and not more than 1200 nm.

Thereafter, a mask which has openings is lithographically formed over the interlayer insulation film 10, and then dry etching, such as RIE, is performed to form openings 10a, 10b in the interlayer insulation film 10. The opening 10a is formed at such a position that the body contact region 6 and part of the source region 5 surrounding the body contact region 6 are exposed. The opening 10b is formed at such a position that part of the gate electrode 9 is exposed. The interlayer insulation film 10 has a function of electrically insulating the pad electrode 13 (shown in, for example, FIG. 1) and the gate electrode 9 from each other and a function of preventing moisture and impurities from diffusing into the semiconductor device. In the present embodiment, the interlayer insulation film 10 is formed not only in the DMISFET region 17 but also in the terminal guard-ring region 18.

Then, as shown in FIG. 9(c), a metal layer is deposited over the surface of the interlayer insulation film 10 and in the openings 10a, 10b and thereafter patterned and thermally treated to form a source ohmic electrode 11 and a gate ohmic electrode 11a. The metal material used for the source ohmic electrode 11 and the gate ohmic electrode 11a is, for example, Ni or Ti. Formation of the metal layer may be realized by, for example, EB deposition or sputtering. The thickness of the metal layer may be, for example, about 100 nm.

Patterning of the metal layer may be realized by lithographically forming a mask which defines the pad electrode 13 and then performing dry etching, such as RIE, or wet etching with the use of a phosphoric acid based solution. After the patterning of the metal layer, the patterned metal layer is thermally treated to form the gate ohmic electrode 11a and the source ohmic electrode 11. Here, the gate ohmic electrode 11a is made of an alloy which is composed of the polysilicon of the gate electrode 9 and the metal layer, and the source ohmic electrode 11 is made of an alloy which is composed of silicon carbide of the source region 5 and the contact region 6 and the metal layer. The thermal treatment for formation of the gate ohmic electrode 11a and the source ohmic electrode 11 is carried out in an Ar or $N_2$ atmosphere at a temperature of 850° C. to 1000° C.

Then, a metal layer is deposited over the opposite side of the silicon carbide substrate 1 and thereafter patterned and thermally treated to form a drain ohmic electrode 12. The metal material used for the drain ohmic electrode 12 is, for example, Ni or Ti. Formation of the metal layer may be realized by, for example, EB deposition or sputtering. The thickness of the metal layer may be, for example, about 100 nm. After the formation of the metal layer, the metal layer is thermally treated to form the drain ohmic electrode 12, which is made of an alloy that is composed of silicon carbide of the silicon carbide substrate 1 and the metal layer. The thermal treatment for formation of the drain ohmic electrode 12 is carried out in an Ar or $N_2$ atmosphere at a temperature of 850° C. to 1000° C. By this deposition, the drain ohmic electrode 12 is formed at the opposite side of the silicon carbide substrate 1. In the present embodiment, the thermal treatment for formation of the drain ohmic electrode 12 is separately performed from the thermal treatment for formation of the source ohmic electrode 11 and the gate ohmic electrode 11a. However, these thermal treatments may be performed concurrently.

Then, an aluminum layer or aluminum alloy layer is deposited over the interlayer insulation film 10, the source ohmic electrode 11 and the gate ohmic electrode 11a and patterned to form a pad electrode 13. Deposition of the aluminum layer or aluminum alloy layer which forms the pad electrode 13 may be realized by, for example, EB deposition or sputtering. The thickness of the pad electrode 13 is, for example, about 4 μm. Patterning of the deposited aluminum layer or aluminum alloy layer may be realized by lithographically forming a mask which defines the pad electrode 13 and then performing dry etching, such as RIE, or wet etching with the use of a phosphoric acid based solution.

Thereafter, as shown in FIG. 9(d), a first protective insulation film (stress reducing film) 14 and a second protective insulation film (passivation film) 15 are formed over the pad electrode 13 and part of the interlayer insulation film 10 which is exposed through an opening 13a. The first protective insulation film 14 may be made of an insulation film material which has a linear expansion coefficient between the linear expansion coefficient of the material of the interlayer insulation film 10 and the linear expansion coefficient of the material of the second protective insulation film 15. More specifically, the first protective insulation film 14 may be realized by forming a film which has a linear expansion coefficient of $(4.5 \pm 1) \times 10^{-6}$ (/° C.). For example, as the first protective insulation film 14, an oxide of aluminum ($Al_2O_3$) or a nitride of aluminum (AlN), or a multilayer film thereof, may be formed by thermal spraying so as to have a thickness not less than about 500 nm and not more than about 1000 nm. The thickness of the first protective insulation film 14 is, more preferably, not less than 500 nm and not more than 800 nm. After the deposition of the first protective insulation film 14, a 1.5 μm thick silicon nitride (SiN) is deposited by plasma CVD as the second protective insulation film 15.

Thereafter, as shown in FIG. 9(e), a mask (not shown) which has an opening is lithographically formed over the second protective insulation film 15. Then, the mask is used to perform dry etching, such as RIE, such that part of the passivation film (SiN) 15 which is exposed through the opening is removed. Thereby, part of the second protective insulation film 15 extending above the pad electrode 13 is at least partially removed.

Then, as shown in FIG. 9(f), dry etching, such as RIE, is performed using the opening of the second protective insulation film 15 as a mask, whereby part of the first protective insulation film 14 which is exposed through the opening is removed. Thereby, the pad electrode 13 is exposed at the surface, so that the pad electrode 13 can be electrically coupled to an external component.

Further, a opposite side electrode 16 is formed over the lower surface of the drain ohmic electrode 12. The opposite side electrode 16 may be realized by forming a multilayer structure, such as Ti layer/Ni layer/Ag layer, for example.

The present invention has been described in the above with an embodiment that is suitable to a vertical power MISFET which has a terminal guard-ring region of the FLR structure. However, the present invention is not limited to this embodiment but is suitably applicable to other types of terminal structures, such as a RESURF structure, and to other types of power devices, such as a diode and a bipolar transistor. For example, the present invention is also applicable to a horizontal MISFET, a pn junction diode, a Schottky junction diode, a junction field effect transistor (JFET), an insulated gate bipolar transistor (IGBT), etc. The present embodiment has been described with an example of a power semiconductor device which is fabricated based on silicon carbide but may be suitably applicable to other types of wide bandgap semiconductor materials, such as gallium nitride (GaN), diamond, etc.

INDUSTRIAL APPLICABILITY

The present invention is suitably applicable to a variety of semiconductor devices of which high breakdown voltage characteristic and high reliability are demanded. Particularly, the present invention is suitably applicable to a vertical diode or transistor which is built on a SiC substrate.

REFERENCE SIGNS LIST 1 silicon carbide substrate
2 silicon carbide buffer layer
3, 103 silicon carbide drift epi-layer
4, 104 well region
5 source region
6 body contact region
7 channel epi-layer
8 gate insulation film
8a insulation film
9 gate electrode
10, 110 interlayer insulation film
10a, 10b opening
11 source ohmic electrode
11a gate ohmic electrode
12 drain ohmic electrode
13, 113 pad electrode
14 first protective insulation film (stress reducing film)
15, 115 second protective insulation film (passivation film)
16, 116 opposite side electrode
17, 117 semiconductor device (DMISFET) region
18, 118 terminal guard-ring region
19, 119 chip coating material (JCR)
20, 120 semiconductor ring region
30, 130 high electric field region

The invention claimed is:

1. A semiconductor device which has a semiconductor element region that is provided in part of a silicon carbide layer and a guard-ring region that is provided in another part of the silicon carbide layer surrounding the semiconductor element region when seen in a direction perpendicular to a principal surface of the silicon carbide layer, the semiconductor device comprising:
an interlayer insulation film which is provided on the principal surface of the silicon carbide layer in the semiconductor element region and the guard-ring region, the interlayer insulation film having a relative dielectric constant of 20 or more;
a first protective insulation film provided on the interlayer insulation film in the guard-ring region, the first protective insulation film being electrically insulative; and
a second protective insulation film provided on the first protective insulation film,
wherein the first protective insulation film has a linear expansion coefficient which is between a linear expansion coefficient of a material of the second protective insulation film and a linear expansion coefficient of a material of the interlayer insulation film, and
wherein the semiconductor element region includes a field effect transistor, the field effect transistor comprising:
a silicon carbide substrate of a first conductivity type, having the silicon carbide layer on one principal surface thereof;
a gate insulation film provided on the principal surface of the silicon carbide layer;
a gate electrode provided on the gate insulation film;
a source electrode provided on the principal surface of the silicon carbide layer;
a drain electrode provided on another principal surface of the silicon carbide substrate; and
a pad electrode provided over the gate electrode with the interlayer insulation film interposed therebetween, the pad electrode being electrically connected to the source electrode,
the first protective insulation film and the second protective insulation film are not located between the gate electrode and the pad electrode, and
the first protective insulation film and the second protective insulation film cover a part of the pad electrode.

2. The semiconductor device of claim 1, wherein a difference between the linear expansion coefficient of the material of the first protective insulation film and a linear expansion coefficient of silicon carbide is smaller than a difference between the linear expansion coefficient of the material of the second protective insulation film and the linear expansion coefficient of silicon carbide.

3. The semiconductor device of claim 1, wherein
the first protective insulation film and the second protective insulation film are provided in the guard-ring region, and
none of the first protective insulation film and the second protective insulation film is provided in at least part of the semiconductor element region.

4. The semiconductor device of claim 1, wherein the interlayer insulation film is made of a material selected from a group consisting of a zirconium oxide, a hafnium oxide, and a titanium oxide.

5. The semiconductor device of claim 1, wherein the first protective insulation film is made of a material selected from a group consisting of an aluminum oxide and an aluminum nitride.

6. The semiconductor device of claim 1, wherein
a total of a thickness of the interlayer insulation film and a thickness of the first protective insulation film is not less than 1.5 μm, and
the thickness of the interlayer insulation film is greater than the thickness of the first protective insulation film.

7. The semiconductor device of claim 1, wherein the second protective insulation film is made of an insulative material which contains a silicon nitride.

8. The semiconductor device of claim 7, wherein the silicon nitride contained in the second protective insulation film has a linear expansion coefficient which is not less than $2.5 \times 10^{-6}$ and not more than $3.0 \times 10^{-6}/°C$.

9. The semiconductor device of claim 7, wherein a thickness of the second protective insulation film is not less than 1.5 μm.

10. The semiconductor device of claim 1, wherein the semiconductor element region includes a diode.

11. A method of fabricating a semiconductor device which has a semiconductor element region that is provided in part of a silicon carbide layer and a guard-ring region that is provided in another part of the silicon carbide layer surrounding the semiconductor element region when seen in a direction perpendicular to a principal surface of the silicon carbide layer, the method comprising the steps of:
forming an interlayer insulation film on the silicon carbide layer in the semiconductor element region and the guard-ring region, the interlayer insulation film having a relative dielectric constant of 20 or more;
forming a first protective insulation film on the interlayer insulation film in the guard-ring region, the first protective insulation film being electrically insulative; and
forming a second protective insulation film on the first protective insulation film,
wherein the first protective insulation film has a linear expansion coefficient which is between a linear expansion coefficient of a material of the second protective insulation film and a linear expansion coefficient of a material of the interlayer insulation film, and wherein the semiconductor element region includes a field effect transistor, the field effect transistor comprising:
  a silicon carbide substrate of a first conductivity type, having the silicon carbide layer on one principal surface thereof;
  a gate insulation film provided on the principal surface of the silicon carbide layer;
  a gate electrode provided on the gate insulation film;
  a source electrode provided on the principal surface of the silicon carbide layer;
  a drain electrode provided on another principal surface of the silicon carbide substrate; and
  a pad electrode provided over the gate electrode with the interlayer insulation film interposed therebetween, the pad electrode being electrically connected to the source electrode,
  the first protective insulation film and the second protective insulation film are not located between the gate electrode and the pad electrode, and
  the first protective insulation film and the second protective insulation film cover a part of the pad electrode.

* * * * *